United States Patent
Pan

(10) Patent No.: US 10,629,713 B2
(45) Date of Patent: Apr. 21, 2020

(54) BIPOLAR JUNCTION TRANSISTOR AND METHOD FOR FABRICATING THE SAME

(71) Applicant: UNITED MICROELECTRONICS CORP., Hsin-Chu (TW)

(72) Inventor: Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/239,447

(22) Filed: Jan. 3, 2019

(65) Prior Publication Data

US 2019/0140083 A1 May 9, 2019

Related U.S. Application Data

(62) Division of application No. 15/717,975, filed on Sep. 28, 2017, now Pat. No. 10,217,853.

(30) Foreign Application Priority Data

Aug. 28, 2017 (TW) .............................. 106129133 A

(51) Int. Cl.
| | |
|---|---|
| *H01L 21/265* | (2006.01) |
| *H01L 29/739* | (2006.01) |
| *H01L 29/08* | (2006.01) |
| *H01L 29/36* | (2006.01) |
| *H01L 29/06* | (2006.01) |
| *H01L 21/225* | (2006.01) |
| *H01L 29/66* | (2006.01) |
| *H01L 29/10* | (2006.01) |
| *H01L 21/324* | (2006.01) |
| *H01L 21/762* | (2006.01) |

(52) U.S. Cl.
CPC ...... *H01L 29/7393* (2013.01); *H01L 21/2253* (2013.01); *H01L 21/26513* (2013.01); *H01L 21/324* (2013.01); *H01L 21/76229* (2013.01); *H01L 29/0657* (2013.01); *H01L 29/0808* (2013.01); *H01L 29/1008* (2013.01); *H01L 29/36* (2013.01); *H01L 29/66325* (2013.01); *H01L 21/76224* (2013.01); *H01L 29/0649* (2013.01); *H01L 29/0821* (2013.01)

(58) Field of Classification Search
CPC ............. H01L 21/324; H01L 21/76229; H01L 29/0657; H01L 29/0808; H01L 29/1008
See application file for complete search history.

(56) References Cited

U.S. PATENT DOCUMENTS

| | | | |
|---|---|---|---|
| 4,691,219 A * | 9/1987 | Goth | .................... H01L 21/0334 257/518 |
| 7,728,388 B1 | 6/2010 | Tsai | |
| 8,610,241 B1 | 12/2013 | Hu et al. | |
| 8,946,038 B2 | 2/2015 | Hu et al. | |
| 9,035,426 B2 | 5/2015 | Chang et al. | |

(Continued)

*Primary Examiner* — Nathan W Ha
(74) *Attorney, Agent, or Firm* — Winston Hsu

(57) ABSTRACT

A method for fabricating bipolar junction transistor (BJT) includes the steps of: providing a substrate having an emitter region, a base region, and a collector region; performing a first implantation process to form a first well region in the base region; and performing a second implantation process to form a second well region in the emitter region. Preferably, the first well region and the second well region comprise different concentration.

8 Claims, 7 Drawing Sheets

(56) References Cited

U.S. PATENT DOCUMENTS

| | | | |
|---|---|---|---|
| 2008/0006875 A1* | 1/2008 | Ohtsuka | H01L 27/0629 257/341 |
| 2011/0241069 A1 | 10/2011 | Vashchenko | |
| 2013/0075741 A1 | 3/2013 | Mallikarjunaswamy | |
| 2013/0313640 A1 | 11/2013 | Shen | |
| 2013/0328162 A1 | 12/2013 | Hu et al. | |
| 2014/0034999 A1 | 2/2014 | Korec | |
| 2014/0210007 A1 | 7/2014 | Deval | |
| 2014/0367830 A1 | 12/2014 | Zhan | |
| 2015/0179631 A1 | 6/2015 | Tsai | |
| 2015/0249083 A1 | 9/2015 | Okawara | |
| 2016/0111411 A1* | 4/2016 | Kalnitsky | H01L 21/76224 257/526 |
| 2016/0225757 A1* | 8/2016 | Gan | H01L 29/7835 |
| 2017/0125401 A1* | 5/2017 | Gu | H01L 21/266 |

\* cited by examiner

BIPOLAR JUNCTION TRANSISTOR AND METHOD FOR FABRICATING THE SAME

CROSS REFERENCE TO RELATED APPLICATIONS

This application is a division of U.S. application Ser. No. 15/717,975 filed Sep. 28, 2017, and incorporated herein by reference in its entirety.

BACKGROUND OF THE INVENTION

1. Field of the Invention

The invention relates to a method for fabricating bipolar junction transistor (BJT), and more particular to a method of having fabricating BJT with emitter region and base region with different concentration

2. Description of the Prior Art

As is well known to those of skill in the art, a BJT device is a three-terminal device that essentially including an emitter, a base and a collector. In normal operation, the emitter-base junction will be forward biased while the collector-base junction reversed biased by externally applied voltages, and the device is driven in a forward active mode. Furthermore, BJT device can be manufactured using complementary metal-oxide-semiconductor (CMOS) process, and therefore plays an important role in band-gap voltage reference circuits. Accordingly, BJT device often serves as switching device and is often used in high-voltage, high-frequency, and/or high-power applications.

Nevertheless, the design of current BJT device is still insufficient in that high dopant concentration in the emitter region and the base region often degrades the performance of the device substantially. Hence, how to resolve this issue has become an important task in this field.

SUMMARY OF THE INVENTION

According to an embodiment of the present invention, a method for fabricating bipolar junction transistor (BJT) includes the steps of: providing a substrate having an emitter region, a base region, and a collector region; performing a first implantation process to form a first well region in the base region; and performing a second implantation process to form a second well region in the emitter region. Preferably, the first well region and the second well region comprise different concentration.

According to another aspect of the present invention, a bipolar junction transistor (BJT) includes: a substrate having an emitter region, a base region, and a collector region; a first well region disposed in the base region; and a second well region disposed in the emitter region, wherein the first well region and the second well region comprise different concentration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
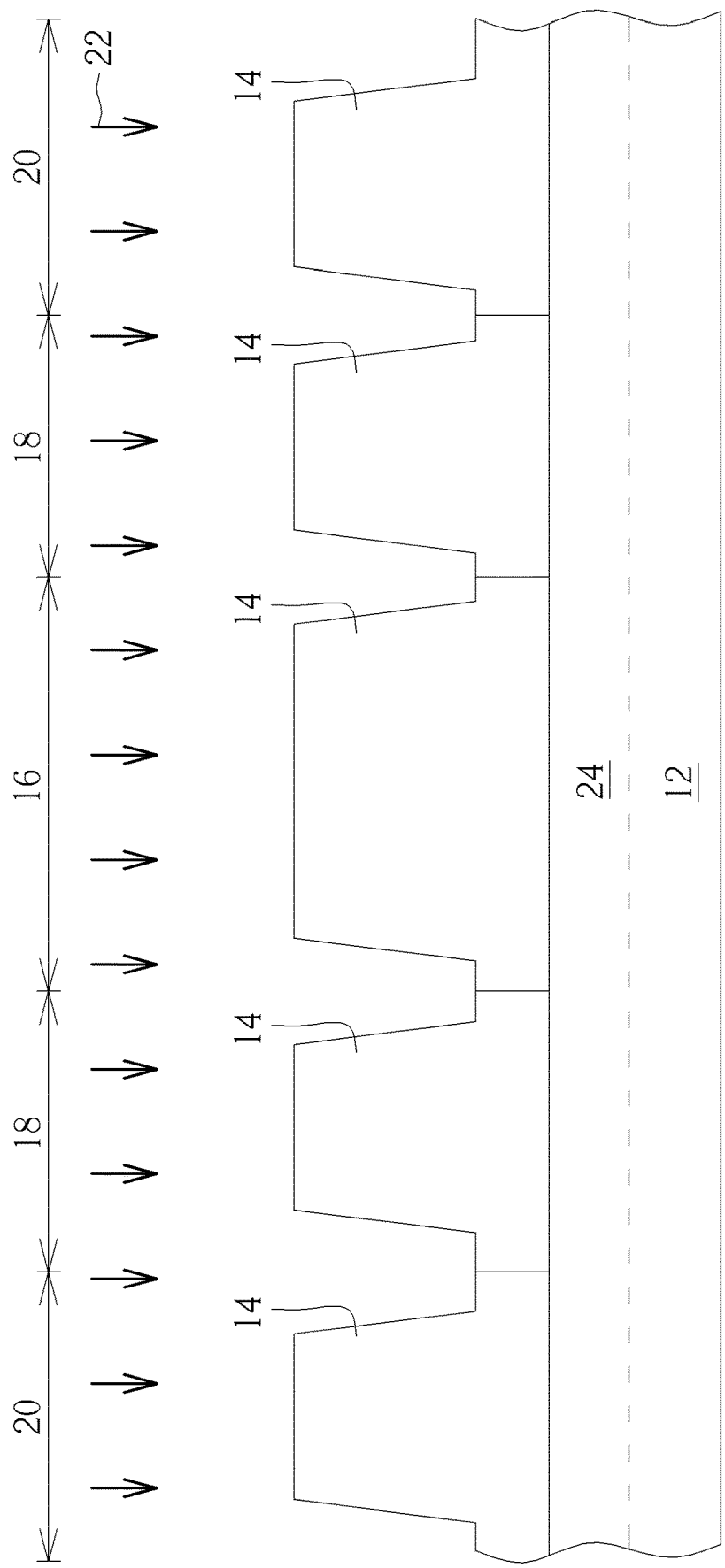
FIGS. 1-7 illustrate a method for fabricating a BJT according to an embodiment of the present invention.

Referring to FIGS. 1-7, FIGS. 1-7 illustrate a method for fabricating a BJT according to an embodiment of the present invention. As shown in FIG. 1, a substrate 12, such as a silicon substrate or a silicon-on-insulator (SOI) substrate is first provided, multiple fin-shaped structures 14 are formed on the substrate 12, and an emitter region 16, a base region 18, and a collector region 20 are defined on the substrate 12. In this embodiment, the emitter region 16 is preferably disposed on the central fin-shaped structure 14, the base region 18 is defined on the fin-shaped structures 14 adjacent to two sides of the emitter region 16, and the collector region 20 is defined on the fin-shaped structures 14 adjacent to two sides of the base region 18. It should be noted that even though this embodiment pertains to the fabrication of a non-planar FET device such as FinFET device, it would also be desirable to apply the following process to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, an ion implantation process 22 is conducted to implant dopants having second conductive type (such as n-type) into the substrate 12 under the fin-shaped structures 14 on the emitter region 16, base region 18, and collector region 20 for forming a deep well region such as a deep n-well 24.

Figure 2:
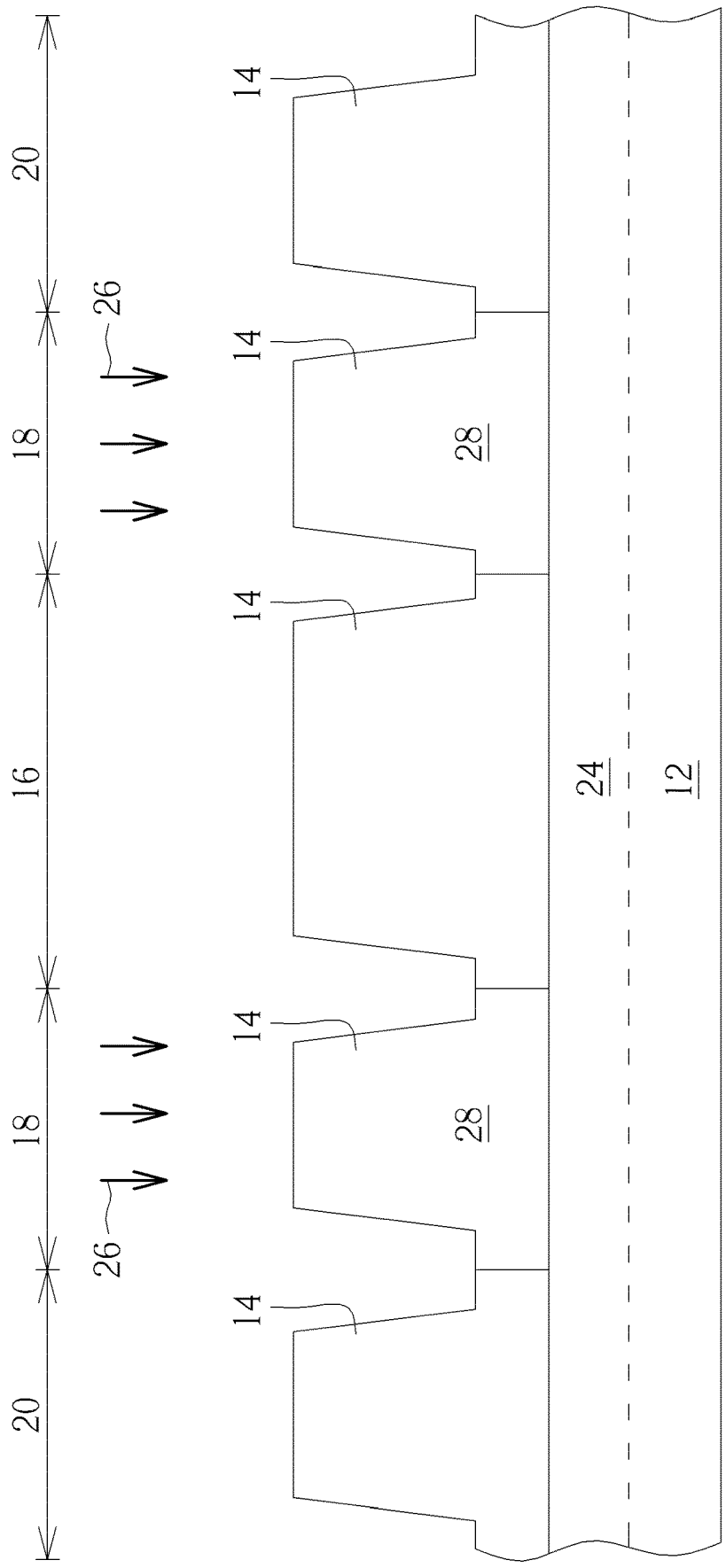

Next, as shown in FIG. 2, another ion implantation process 26 is conducted to implant dopants having first conductive type (such as p-type) into the fin-shaped structures 14 on the base region 18 and part of the substrate 12 under the fin-shaped structures 14 for forming at least a well region such as a p-well 28. Preferably, a patterned mask (not shown) is formed to cover the emitter region 16 and the collector region 20 before the implantation process 26 is conducted so that p-type dopants or ions would only be injected into the fin-shaped structures 14 and part of the substrate 12 on the base region 18 but not into the fin-shaped structures 14 on the emitter region 16 and the collector region 20.

Figure 3:
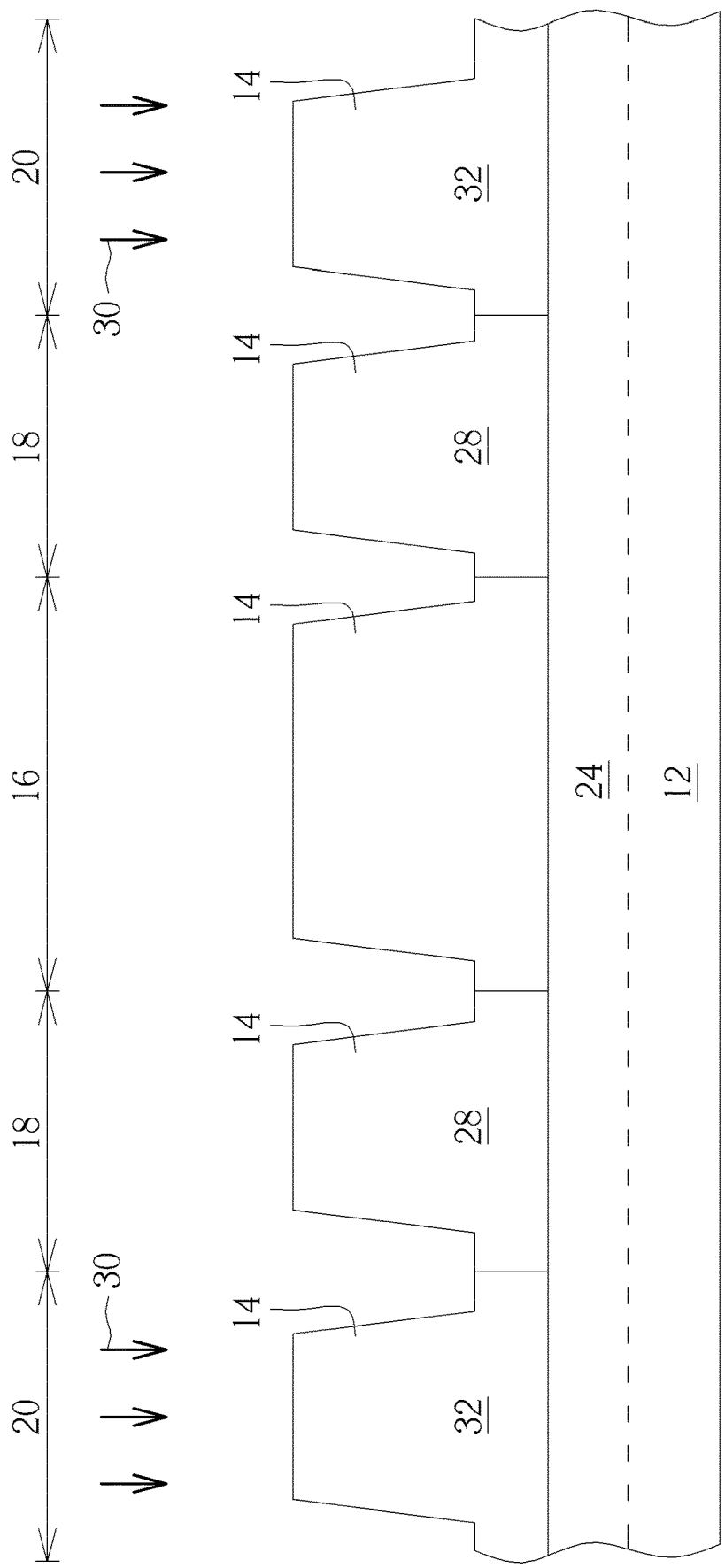

Next, as shown in FIG. 3, another ion implantation process 30 is conducted to implant dopants having second conductive type (such as n-type) into the fin-shaped structures 14 on the collector region 20 as well as part of the substrate 12 directly under the fin-shaped structures 14 on the collector region 20 for forming at least a well region such as n-well 32. Similar to the formation of the p-well 28, it would be desirable to form a patterned mask (not shown) to cover the emitter region 16 and the base region 18 before the ion implantation process 30 is conducted so that n-type dopants or ions would only be injected into the fin-shaped structures 14 and part of the substrate 12 on the collector region 20 but not into the fin-shaped structures 14 on the emitter region 16 and the base region 18. Next, a thermal treatment process could be conducted to activate the dopants implanted into each of the well regions including the deep n-well 24, the p-well 28, and the n-well 32. Preferably, the fin-shaped structure 14 on the emitter region 16 still remains to be an undoped region at this stage.

Figure 4:
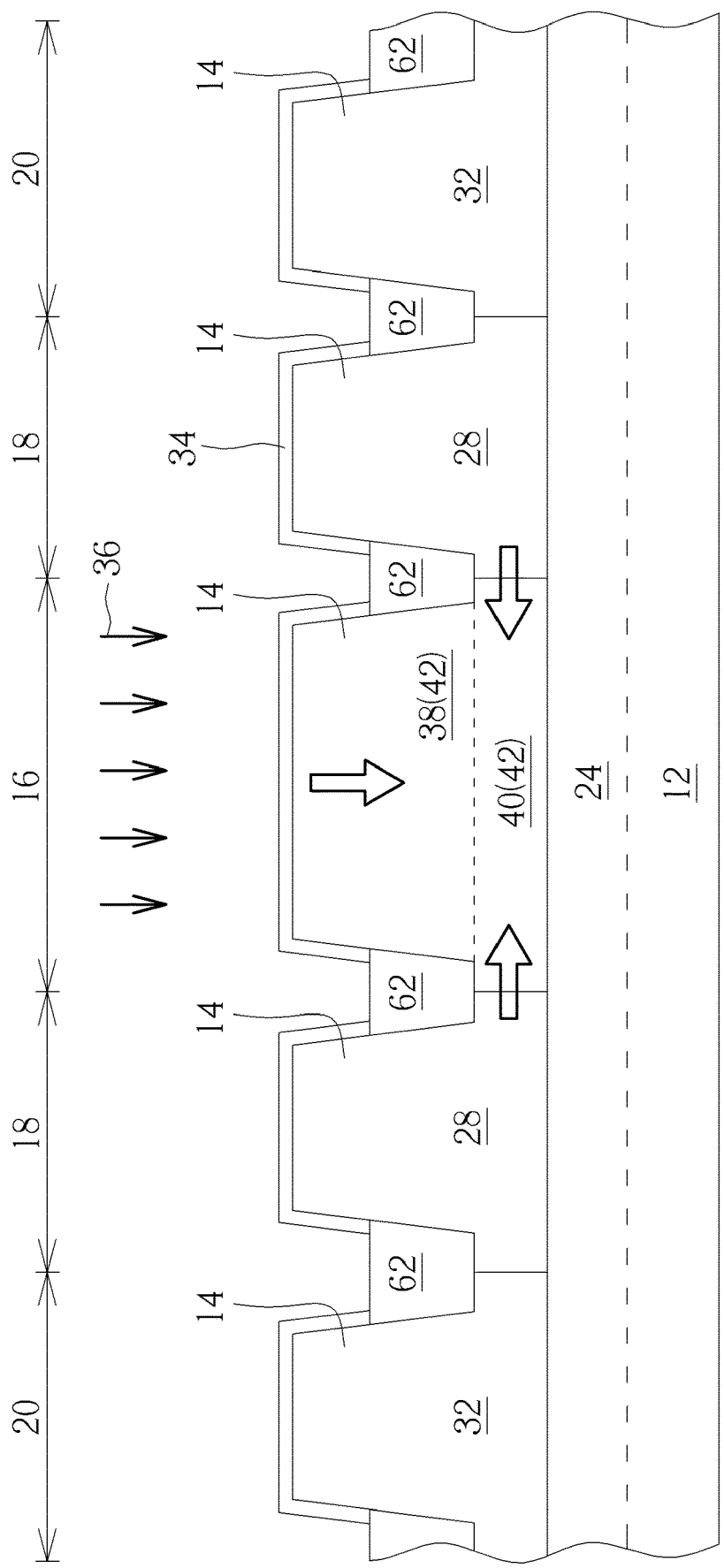

Next, as shown in FIG. 4, a shallow trench isolation (STI) 62 made of dielectric material including but not limited to for example silicon oxide could be formed around the fin-shaped structures 14, a gate dielectric layer 34 is formed in the fin-shaped structures 14 on each region, and an ion implantation process 36 is conducted to implant dopants having first conductive type (such as p-type) into the fin-shaped structure 14 on the emitter region 16 for forming a first region 38 and a second region 40 directly under the first region 38. Preferably, the dosage and energy of the ion implantation process 36 are both less than the dosage and energy used in the ion implantation process 26 so that the first region 38 preferably becomes a doped region with implanted p-type dopants while the second region 40 remains to be an undoped region and the depth of the first region 38 is preferably less than the depth of the p-well 28 on the base region 18.

Next, a thermal treatment process is conducted to diffuse the dopants in the first region 38 downward and at the same time diffuse the dopants from the adjacent p-well 28 to the second region 40 for forming another p-well 42. Specifically, the p-well 42 is preferably formed by dopants diffused from two paths, which preferably includes p-type dopants diffused from the first region 38 following the direction of the down arrow downward as well as p-type dopants diffused from the adjacent p-well 28 on the base region 18 following the direction of the left and right arrows through the substrate 12 under the fin-shaped structures 14 to the second region 40 on the emitter region 16.

In this embodiment, the concentration of the p-well 42 formed on the emitter region 16 is preferably less than the concentration of p-well 28 on the base region 18. For instance, the concentration of the p-well 42 is preferably between $3\times10^{13}$ ions/cm$^2$ to $4\times10^{13}$ ions/cm$^2$ and the concentration of the p-well 28 is preferably between $1\times10^{14}$ ions/cm$^2$ to $1.21\times10^{14}$ ions/cm$^2$. In contrast to the conventional BJT typically having p-wells with equal concentration on both emitter region and base region, the present invention preferably implants dopants of different concentration into the emitter region 16 and base region 18 respectively under different stages. This forms a p-well 28 with substantially higher concentration in the base region 18 and at the same time forms a p-well 42 with relatively lower concentration in the emitter region 16 to improve the performance of the BJT device.

Figure 5:
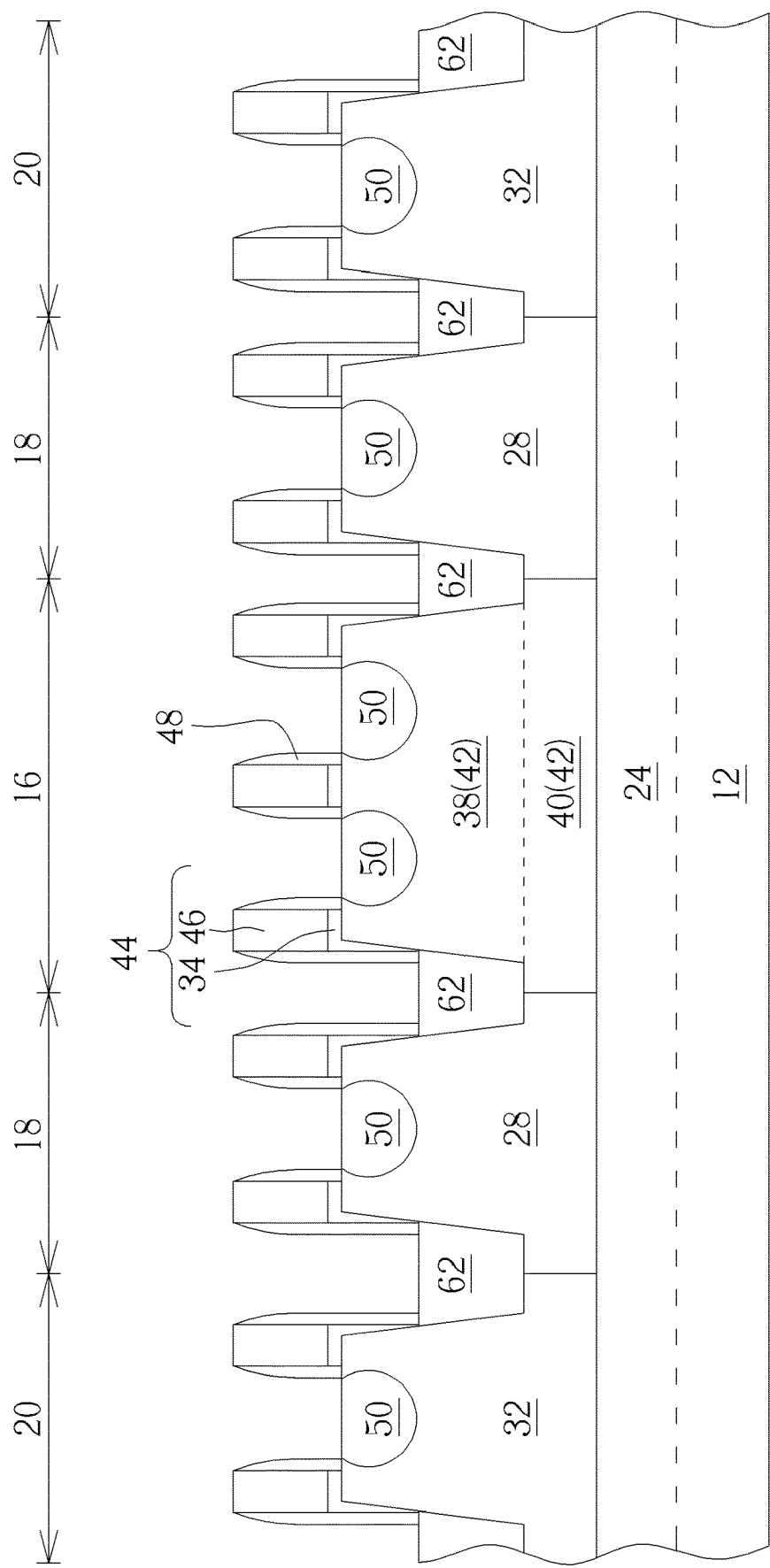

Next, as shown in FIG. 5, at least a gate structure or dummy gate 44 is formed on each of the emitter region 16, base region 18, and collector region 20. In this embodiment, the formation of the dummy gates 44 could be accomplished by a gate first process, a high-k first approach from gate last process, or a high-k last approach from gate last process. Since this embodiment pertains to a high-k last approach, a gate material layer 46 made of polysilicon and a selective hard mask could be formed sequentially on the substrate 12, and a pattern transfer process is then conducted by using a patterned resist (not shown) as mask to remove part of the gate material layer 46 and part of the gate dielectric layer 34 through single or multiple etching processes. After stripping the patterned resist, dummy gates 44 or gate structures each composed of a patterned gate dielectric layer 34 and patterned gate material layer 46 are formed on the substrate 12.

Next, at least a spacer 48 is formed on the sidewalls of each of the dummy gates 44, source/drain regions 50 and/or epitaxial layer (not shown) are formed in the fin-shaped structure 14 adjacent to two sides of the spacers 48, and selective silicide layers (not shown) could be formed on the surface of the source/drain regions 50. In this embodiment, each spacer 48 could be a single spacer or a composite spacer, such as a spacer including but not limited to for example an offset spacer (not shown) and a main spacer (not shown). Preferably, the spacer 48 in this embodiment includes dielectric material such as silicon nitride. Nevertheless, the spacers 48 could also be made of material including but not limited to for example SiO$_2$, SiN, SiON, SiCN, or combination thereof.

Moreover, the source/drain regions 50 on the emitter region 16 and the collector region 20 preferably include same conductive type such as n-type dopants and the epitaxial layers disposed on the emitter region 16 and the collector region 20 preferably include silicon phosphide (SiP). The source/drain region 50 on the base region 18 on the other hand preferably includes p-type dopants and the epitaxial layer disposed on the base region 18 preferably includes silicon germanium (SiGe).

Figure 6:
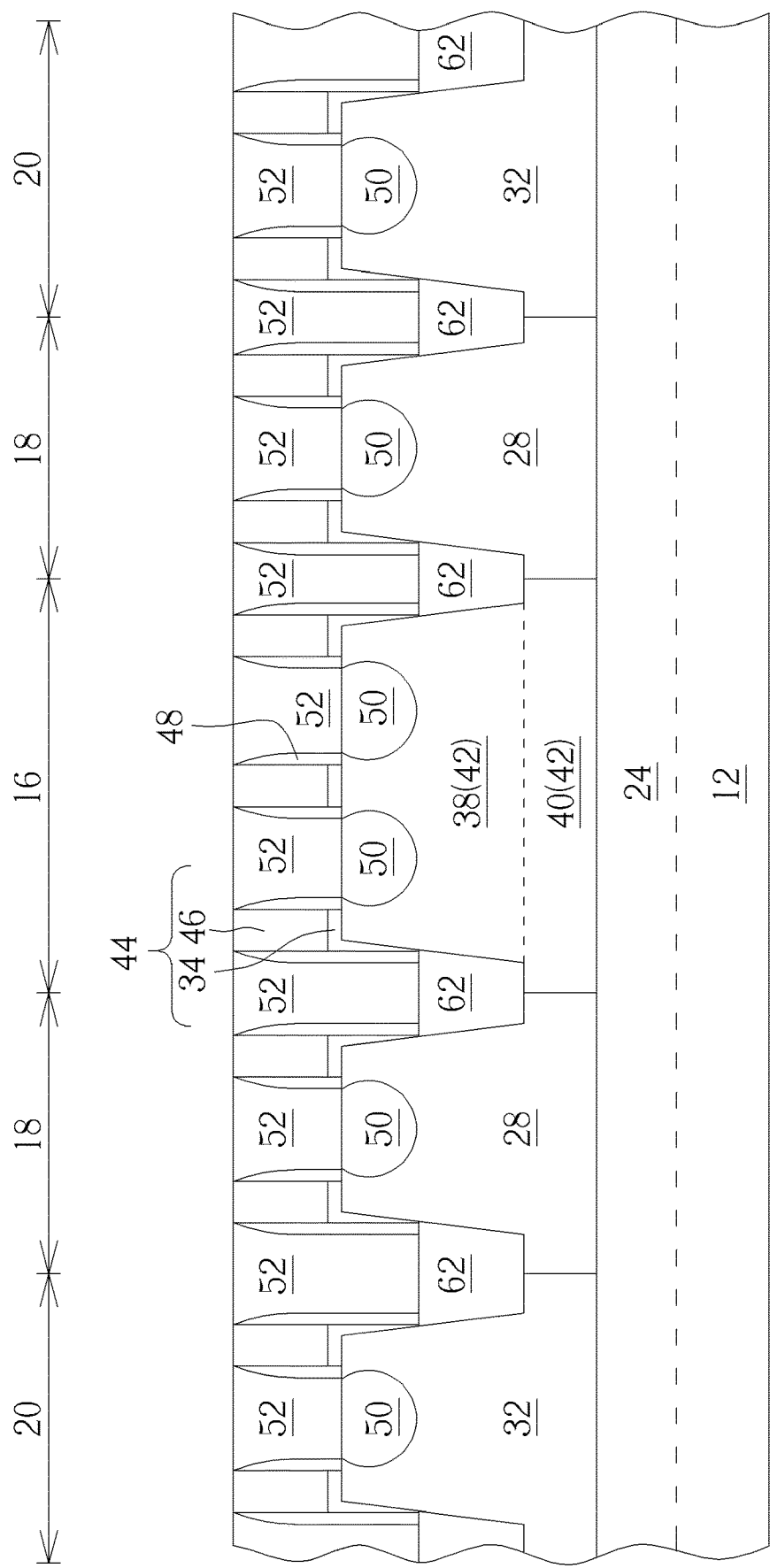

Next, as shown in FIG. 6, a contact etch stop layer (CESL) (not shown) could be formed on the surface of the fin-shaped structures 14 and covering the dummy gates 44, and an interlayer dielectric (ILD) layer 52 is formed on the CESL. Next, a planarizing process such as chemical mechanical polishing (CMP) process is conducted to remove part of the ILD layer 52 and part of the CESL for exposing the gate material layer 46 made of polysilicon so that top surface of the gate material layer 46 is even with the top surface of the ILD layer 52.

Figure 7:
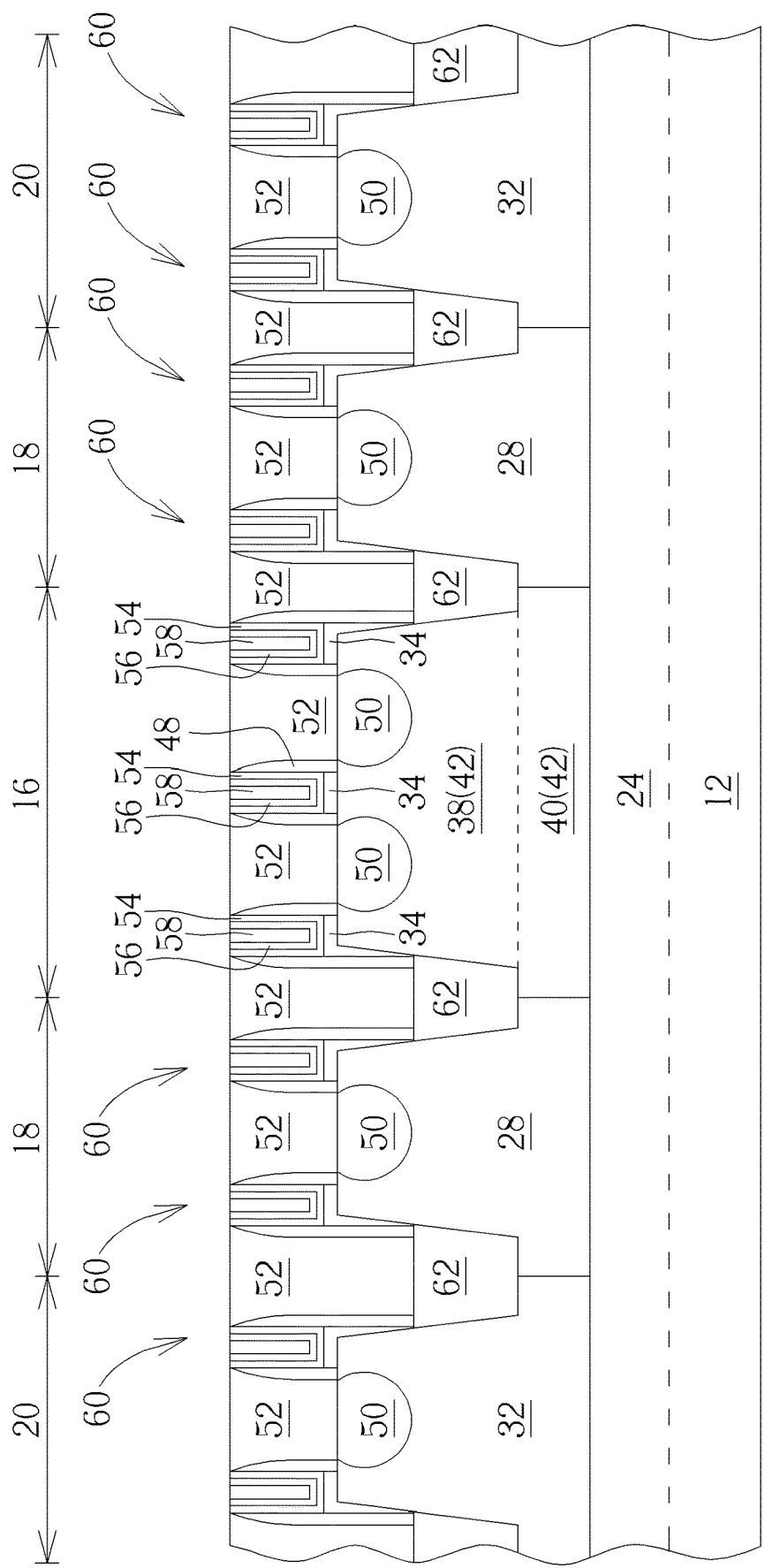

Next, a replacement metal gate (RMG) process is conducted to transform the dummy gates 44 into metal gates. For instance, as shown in FIG. 7, the RMG process could be accomplished by first performing a selective dry etching or wet etching process using etchants including but not limited to for example ammonium hydroxide (NH$_4$OH) or tetramethylammonium hydroxide (TMAH) to remove the gate material layer 46 for forming recesses (not shown) in the ILD layer 52. Next, a high-k dielectric layer 54, a work function metal layer 56, and a low resistance metal layer 58 are formed in the recesses, and a planarizing process such as CMP is conducted to remove part of low resistance metal layer 58, part of work function metal layer 56, and part of high-k dielectric layer 54 to form metal gate 60. In this embodiment, each of the metal gates 60 fabricated through high-k last process of a gate last process preferably includes an interfacial layer or gate dielectric layer 34, a U-shaped high-k dielectric layer 54, a U-shaped work function metal layer 56, and a low resistance metal layer 58.

In this embodiment, the high-k dielectric layer 54 is preferably selected from dielectric materials having dielectric constant (k value) larger than 4. For instance, the high-k dielectric layer 54 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 56 is formed for tuning the work function of the metal gate in accordance with the conductivity of the device. For an NMOS transistor, the work function metal layer 56 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 56 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 56 and the low resistance metal layer 58, in which the material of the barrier layer may include titanium (Ti), titanium nitride (TiN), tantalum (Ta) or tantalum nitride (TaN). Furthermore, the material of the low-resistance metal layer 58 may include copper (Cu), aluminum (Al), titanium aluminum (TiAl), cobalt tungsten phosphide (CoWP) or any combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating bipolar junction transistor (BJT), comprising:
providing a substrate having an emitter region, a base region, and a collector region;
forming fin-shaped structures on the substrate;
performing a first implantation process to form a first well region in the base region;
forming a shallow trench isolation (STI) between the emitter region and the base region;
performing a second implantation process to form a first region in the fin-shaped structures on the emitter region and a second region under the first region, wherein a bottom surface of the first well region is lower than a bottom surface of the first region; and
performing a thermal treatment to diffuse dopants from the first region downward into the second region to form a second well region, wherein the first well region and the second well region comprise different concentrations.

2. The method of claim 1, further comprising:
performing a third implantation process to form a deep well region in the substrate under the fin-shaped structures; and
performing the first implantation process.

3. The method of claim 2, further comprising performing a fourth implantation process between the first implantation process and the second implantation process to form a third well region in the collector region.

4. The method of claim 3, wherein the first well region and the second well region comprise a first conductive type and the deep well region and the third well region comprise a second conductive type.

5. The method of claim 4, wherein the first conductive type comprises p-type and the second conductive type comprises n-type.

6. The method of claim 1, wherein the first region is a doped region and the second region is an undoped region.

7. The method of claim 2, further comprising:
forming a gate dielectric layer on the fin-shaped structures;
performing the second implantation process; and
forming a gate structure on each of the emitter region, the base region, and the collector region.

8. The method of claim 1, wherein a concentration of the second well region is lower than a concentration of the first well region.

* * * * *